(12) United States Patent
Kwean et al.

(10) Patent No.: US 6,825,121 B2
(45) Date of Patent: Nov. 30, 2004

(54) METHOD OF MANUFACTURING A CAPACITOR OF A SEMICONDUCTOR DEVICE

(75) Inventors: Sung-Un Kwean, Yongin-si (KR); Jae-Seung Hwang, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 330 days.

(21) Appl. No.: 10/086,375

(22) Filed: Mar. 4, 2002

(65) Prior Publication Data

US 2002/0127866 A1 Sep. 12, 2002

(30) Foreign Application Priority Data

Mar. 6, 2001 (KR) ........................................ 2001-11542

(51) Int. Cl.⁷ ............................................. H01L 21/302
(52) U.S. Cl. ...................... 438/694; 438/696; 438/700; 438/704; 438/723; 438/743
(58) Field of Search ................................ 438/694, 696, 438/700, 704, 723, 743

(56) References Cited

U.S. PATENT DOCUMENTS

| | | |
|---|---|---|
| 5,656,536 A | 8/1997 | Wu |
| 5,716,884 A | 2/1998 | Hsue et al. |
| 5,807,782 A | 9/1998 | Koh et al. |
| 5,821,141 A * | 10/1998 | Huang ........................ 438/253 |
| 6,037,213 A | 3/2000 | Shih et al. |
| 6,051,485 A * | 4/2000 | Schindler et al. ........... 438/577 |
| 6,174,769 B1 * | 1/2001 | Lou ........................... 438/253 |
| 6,358,842 B1 * | 3/2002 | Zhou et al. ................. 438/633 |
| 6,429,087 B2 * | 8/2002 | Kwok et al. ................ 438/381 |
| 6,468,859 B1 * | 10/2002 | Parekh et al. ............... 438/255 |

FOREIGN PATENT DOCUMENTS

JP        10-093042        4/1998

* cited by examiner

*Primary Examiner*—Nadine G. Norton
*Assistant Examiner*—Binh X. Tran
(74) *Attorney, Agent, or Firm*—Lee & Sterba, P.C.

(57) ABSTRACT

A method of manufacturing a capacitor having increased capacitance using a single photo-lithographic step to form two holes of different sizes in the insulating layers, wherein a first insulating layer, an etching stop layer, and a second insulating layer are sequentially deposited on a semiconductor substrate, a preliminary hole is formed by etching a predetermined portion of the second insulating layer, the preliminary hole is expanded so as to form a first hole, a second hole is formed extending from the bottom of the first hole and having an etched area narrower than an etched area of the first hole, a first conductive layer pattern is formed on the sidewalls of the first and second holes and at the bottom surface of the second hole without burying the second hole, thereby increasing the storage capacitance of the capacitor while simplifying the manufacturing process.

21 Claims, 9 Drawing Sheets

METHOD OF MANUFACTURING A CAPACITOR OF A SEMICONDUCTOR DEVICE

BACKGROUND OF THE INVENTION

1. Field of the Invention

The present invention relates to a method of manufacturing a capacitor and, more particularly, to a method of manufacturing a capacitor capable of simplifying the manufacturing process and increasing a capacitance of the capacitor.

2. Description of the Related Art

Recently, with the widespread use of computers, there has been an increase in demand for semiconductor devices. From a functional aspect, a semiconductor device is required to be operated at a high speed with a large storing capacitance. Accordingly, semiconductor technology is being developed to improve the level or degree of integration, the reliability and the response speed of semiconductor devices.

A DRAM device is widely used as a semiconductor memory device since it has a high capacitance with an ability of freely inputting and outputting information. The DRAM device generally consists of a memory cell area, which stores information in the form of an electric charge and a periphery circuit area for inputting/outputting data. A unit cell of the DRAM device generally includes one transistor and one storage capacitor.

In order to increase the level or degree of integration of the capacitor, the size of the capacitor has to be reduced. In addition, the capacitor is required to have a high storage capacitance to improve the performance of the semiconductor device. Accordingly, capacitor manufacturing process technology is being developed to try to meet the above requirements.

The structure of the capacitor has evolved from a planar capacitor to a stacked capacitor or a trench type capacitor. In the stacked capacitor, a cylindrical capacitor or a fin type capacitor is used so as to enlarge the surface area of a storage electrode.

FIGS. 1A to 1F are sectional views illustrating the manufacturing process of a cylindrical capacitor of a conventional semiconductor device.

Referring to FIG. 1A, a first insulating layer 12 is formed on a semiconductor substrate 10. Then, a photolithography process is carried out with respect to a predetermined portion of the first insulating layer 12 so that an electrode area of the semiconductor 10 is exposed, thereby forming a first hole 14.

Referring to FIG. 1B, a first conductive layer 16 is formed by depositing a conductive material such that the first hole 14 is filled up with the conductive material. Poly-silicon doped with impurities is used as the conductive material to be deposited.

Referring to FIG. 1C, an etch back process is carried out with respect to the first conductive layer 16. Accordingly, the poly-silicon at the top surface of the hole 14 is exposed and the poly-silicon filling in the first hole 14 remains so as to form a contact plug 16a.

Referring to FIG. 1D, an etching stop layer 18 and a second insulating layer 20 are sequentially formed over the contact plug 16a. Then, a predetermined portion of the second insulating layer 20 is etched by performing a photolithography process, so that a second hole 22 exposing the contact plug 16a and a portion of the first insulating layer 12 peripheral to the contact plug 16a are formed. That is, the area of the bottom of the second hole 22 is larger than the area of the top of the contact plug 16a so that the area of the second hole 22 includes the contact plug area 16a and an area of the top surface of the first insulating layer 12 peripheral to the contact plug area 16a.

Referring to FIG. 1E, a second conductive layer 24 is formed on upper portions of the exposed first insulating layer 12 and the contact plug 16a, and on sidewalls of the second hole 22 and upper surface of the second insulating layer 20. Then, the second conductive layer 24 is subject to an etch back process so as to expose the second insulating layer 20 outside of the second hole 22, thereby forming a storage electrode. The etch back process is carried out by a dry etching process or a chemical mechanical polishing (CMP) process.

Referring to FIG. 1F, a dielectric layer 26 and a plate electrode 28 are sequentially formed on the storage electrode so as to form a capacitor.

According to the conventional process as described above, the capacitor has a cylindrical storage electrode, so the storage capacitance can be increased. However, the increase of the storage capacitance is limited. In addition, the photolithography process and the polishing process have to be carried out several times in order to fabricate the capacitor. Therefore, the process time is increased thereby reducing the output of the capacitor manufacturing process.

SUMMARY OF THE INVENTION

The present invention is directed to solve the processing complexities of the prior art and to improve the capacitance value of a capacitor suitable for use in a DRAM cell. It is a feature of an embodiment of the present invention to provide a method of manufacturing a capacitor capable of simplifying the manufacturing process and increasing a capacitance value of the capacitor.

In a feature of an embodiment of the present invention, there is provided a method of manufacturing a capacitor of a semiconductor device in which a first insulating layer, an etching stop layer, and a second insulating layer are sequentially deposited on a semiconductor substrate. A predetermined portion of the second insulating layer is etched so as to form a preliminary hole for exposing the etching stop layer. A first hole is formed by transversely expanding the preliminary hole. A second hole is formed by etching a predetermined portion of the etching stop layer and the first insulating layer at a lower side of the first hole. The second hole exposes a part of an electrode area of the semiconductor substrate. The etched area of the second hole is narrower than the etched area of the first hole. A first conductive layer pattern is deposited uniformly on the sidewalls of the first and second holes and on the bottom surface of the second hole. A dielectric layer and a second conductive layer pattern are sequentially deposited on the first conductive layer pattern, to thereby complete the capacitor of a semiconductor device. The steps of forming the first and the second holes comprise the substeps of: providing a photoresist pattern for forming the preliminary hole on the second insulating layer; anisotropically etching the second insulating layer by using the photoresist pattern as an etching mask thereby forming the preliminary hole for exposing the etching stop layer; isotropically etching a sidewall of the preliminary hole in the second insulating layer, thereby forming the first hole which is transversely expanded; and anisotropically etching a predetermined portion of the exposed etching stop layer and then the first insulating layer at the lower side of the first hole by using the photo-resist pattern as the mask, thereby forming the second hole for exposing the semiconductor substrate. In the present invention, an hole in the photo-resist pattern for the first hole is formed on a portion of the second insulating layer in an area that corresponds to an upper center portion of the electrode area of the semiconductor substrate. The step of forming the first conductive layer pattern comprises the substeps of: depositing a first conductive layer on the sidewalls of the first and second holes, on the bottom surface of the second hole, and on the second insulating layer; and etching back the first conductive layer until the second insulating layer outside the first and second hole is exposed.

Since the first conductive layer pattern is deposited on the sidewall and the bottom surface of the second hole without filling in the second hole, the surface area of the storage electrode is enlarged so that the storage capacitance of the capacitor is increased. In addition, since the manufacturing process is simplified, the throughput of the capacitor is increased.

In another feature of an embodiment of the present invention, the second insulating layer is removed by a selective etching process after forming the first conductive layer pattern, thereby exposing both sides of the first conductive layer pattern above the etching stop layer, which helps to increase the capacitor area. A dielectric layer and a second conductive layer pattern are formed on the first conductive layer pattern resulting in a capacitor having a large capacitance value.

These and other features of the present invention will be readily apparent to those of ordinary skill in the art upon review of the detailed description that follows.

BRIEF DESCRIPTION OF THE DRAWINGS

The above features and other advantages of the present invention will become more apparent by describing in detail preferred embodiments thereof with reference to the attached drawings in which.

DETAILED DESCRIPTION OF THE PREFERRED EMBODIMENTS

Korean Patent Application No. 2001-11542, filed Mar. 6, 2001, and entitled: "Method of Manufacturing A Capacitor of a Semiconductor Device," is incorporated by reference herein in its entirety. Hereinafter, preferred embodiments of the present invention will be described in detail with reference to the accompanying drawings.

First Embodiment

FIGS. 2A to 2H are cross-sectional views of a semiconductor device illustrating a method of manufacturing a capacitor of a semiconductor device according to a first embodiment of the present invention.

In the present embodiment, a method of manufacturing the capacitor of a semiconductor device will be described with reference to a DRAM device having one transistor and one capacitor.

Figure 1A:
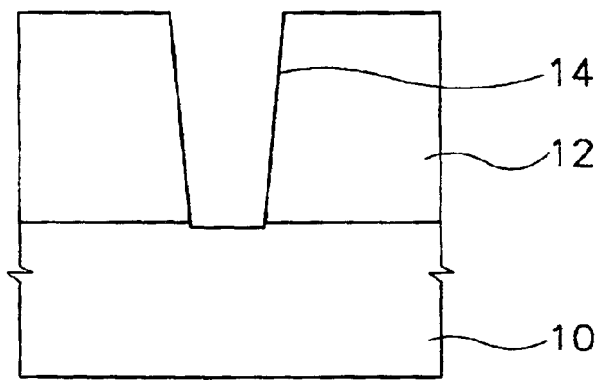
FIGS. 1A to 1F are cross-sectional views of a semiconductor device illustrating a method of manufacturing a cylindrical capacitor of a conventional semiconductor device.
Figure 1B:
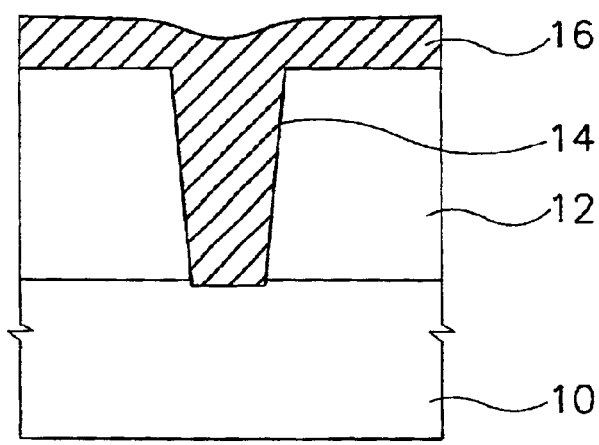
Figure 1C:
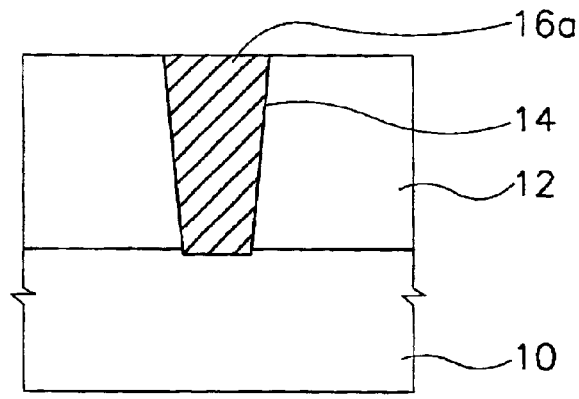
Figure 1D:
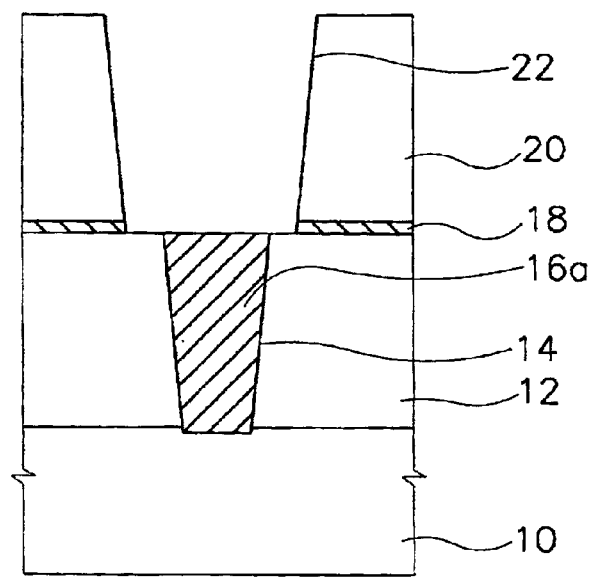
Figure 1E:
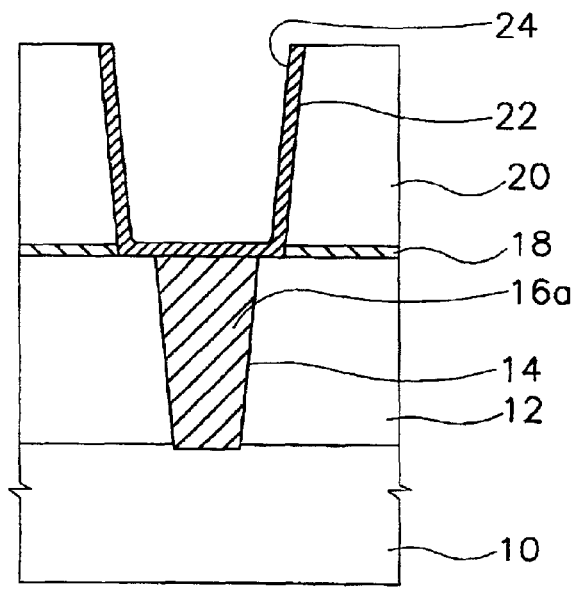
Figure 1F:
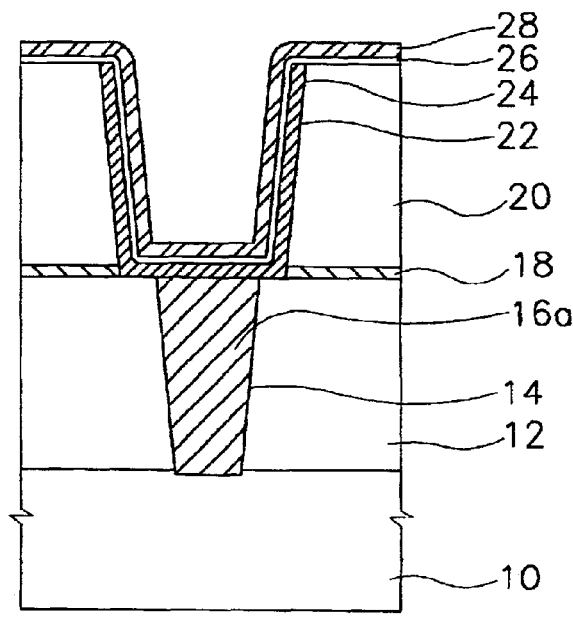
Figure 2A:
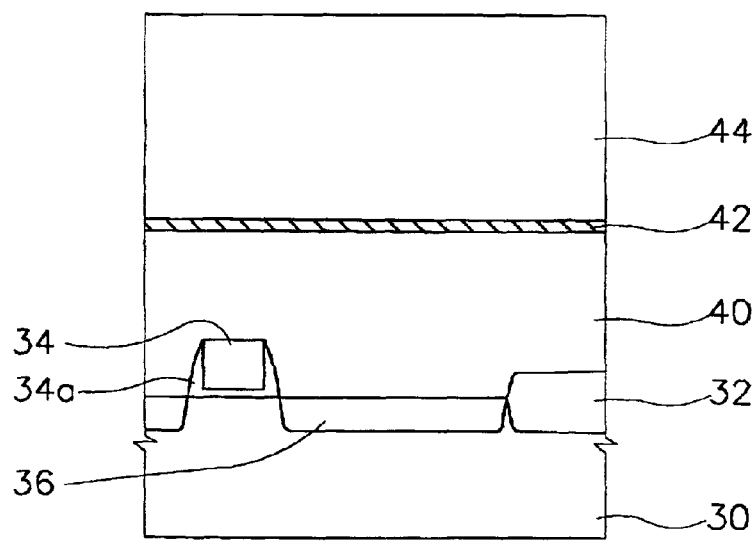
FIGS. 2A to 2H are cross-sectional views of a semiconductor device illustrating a method of manufacturing a capacitor of a semiconductor device according to a first embodiment of the present invention.

Referring to FIG. 2A, a first insulating layer 40, an etching stop layer 42 and a second insulating layer 44 are sequentially deposited on a semiconductor substrate 30 having device elements formed thereon. The device elements formed on the semiconductor substrate 30 include a transistor and a bit line.

Specifically, a field oxide layer 32 for defining an active region is formed on the semiconductor substrate 30 by using a conventional isolation process. Then, after forming a thin gate oxide film on the semiconductor substrate 30, a gate electrode 34 is formed thereon. In order to reduce the resistance of the gate electrode 34, the gate electrode 34 has a polycide structure consisting of a polysilicon layer and a tungsten silicide layer stacked on the polysilicon layer, wherein high density impurities are doped into the polysilicon layer through a doping process, such as a diffusing process, an ion implanting process or an in-situ doping process. In addition, the gate electrode 34 is capped with an oxide film or a nitride film and then a spacer 34a made of the oxide film or the nitride film is formed on the sidewalls of the gate electrode 34. Then, an impurity ion implanting process is carried out, by using the gate electrode 34 as a mask, so that the source/drain regions 36 of a transistor are formed at the surface portions of the active regions.

An insulating interlayer is formed, by depositing a BPSG (borophosphosilicate glass) layer or a USG (undoped silicate glass) layer, which has superior planarizing characteristics, on the semiconductor substrate 30 having the transistor. Then, the insulating interlayer is planarized through a reflowing process, an etch-back process or a chemical mechanical polishing (CMP) process. The insulating interlayer is etched through a photolithography process so that a bit line contact hole (not shown) is formed. Then, after a doped polysilicon layer is deposited such that the bit line contact hole is filled up with the doped polysilicon layer, a tungsten silicide layer is formed on the doped polysilicon layer. Another photolithography process is carried out for patterning the doped polysilicon layer and the tungsten silicide layer, thereby forming a bit line (not shown) having a polycide structure.

The first insulating layer 40, the etching stop layer 42 and the second insulating layer 44 are sequentially deposited on the semiconductor substrate 30 formed with the above device elements. The first insulating layer 40 is formed, by depositing an insulating material on the insulating interlayer. In the following description, the first insulating layer 40 includes the insulating interlayer that has been already formed on the semiconductor substrate 30.

The first and second insulating layers 40 and 44 are used for forming storage electrodes through the following processes and insulate the storage electrodes from each other. The first and second insulating layers 40 and 44 are formed by depositing BPSG or USG having a good insulating and reflowing characteristics to a thickness of 100 to 1500 nm In addition, the etching stop layer 42 is provided between the first and second insulating layers 40 and 44 so as to allow the user to check the end point of etching process when the second insulating layer 44 is etched. Accordingly, the etching stop layer 42 is formed by depositing a material which has a high etching selectivity (i.e., a high etching rate difference) with respect to the second insulating layer 44. Preferably, the etching stop layer 42 is formed, by depositing a silicon nitride ($Si_xN_y$) or a silicon oxy-nitride (SiON) material to a thickness of 5 to 200 nm, considering the etching selectivity.

Figure 2B:
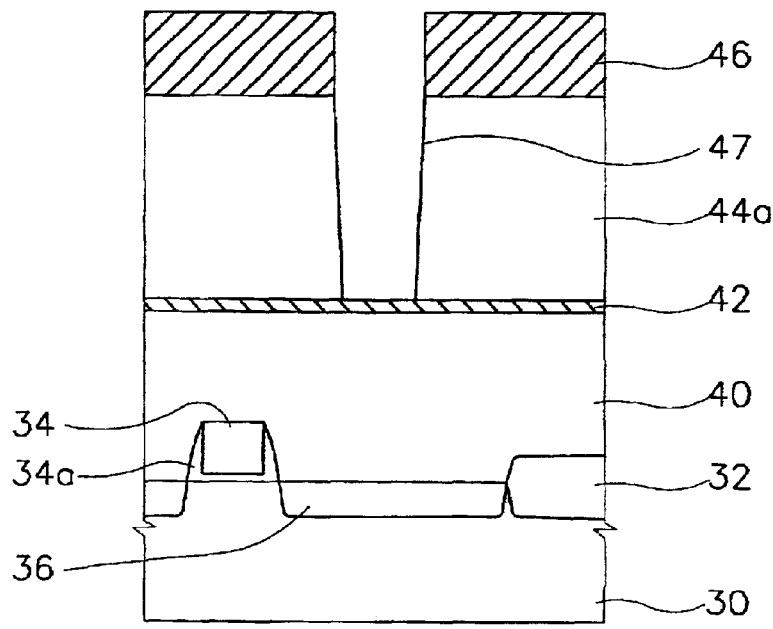

Referring to FIG. 2B, a predetermined portion of the second insulating layer 44 is etched such that the etching stop layer 42 is exposed, thereby forming a preliminary hole 47.

Particularly, a photo-resist composition is coated on the second insulating layer 44 and a photo-resist pattern 46 is formed, by exposing a predetermined portion of the second insulating layer 44, which will be etched later. That is, the photoresist pattern 46 is formed by exposing the predetermined portion of the second insulating layer 44 in such a manner that a portion of the second insulating layer 44 corresponding to an upper center portion of the electrode area of the semiconductor substrate 30 can be etched. In case of the DRAM device, the electrode area of the capacitor corresponds to a source region 36 or a drain region of the transistor. In the present embodiment, the electrode area is the source region 36.

By using the photo-resist pattern 46 as an etching mask, the second insulating layer 44 is anisotropically etched such that the etching stop layer 42 is exposed, thereby forming a first pattern 44a of the second insulating layer having the preliminary hole 47. The anisotropic etching process is carried out by supplying a mixed gas of $C_5F_8$, $O_2$, $CH_2F_2$, Ar, and CO, at an appropriate combination of the gas components. Since the etching rate of the etching stop layer 42 is slower than the etching rate of the second insulating layer 44, the second insulating layer 44 can be precisely etched to the predetermined portion. At this time, the etching stop layer 42 acts as an etching end point.

Figure 2C:
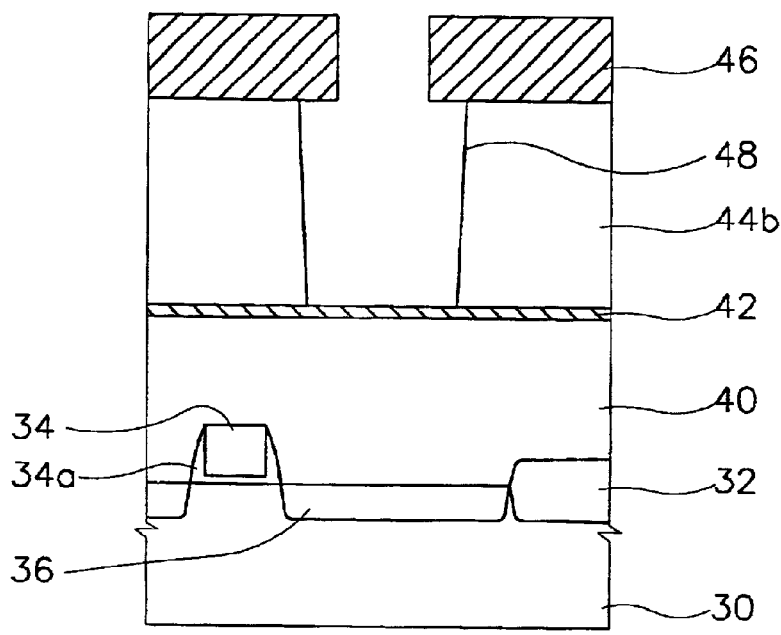

Referring to FIG. 2C, a first hole 48 is formed by transversely expanding the preliminary hole 47. Specifically, the sidewall of the preliminary hole 47 is isotropically etched by using the photoresist pattern 46 as an etching mask, so that the etched portion of the preliminary hole 47 is transversely expanded thereby forming a second pattern 44b of the second insulating layer having the first hole 48. That is, when the isotropic etching process is carried out, the etching rate in the transverse direction of the first pattern 44a, which corresponds to the sidewall of the preliminary hole 47, is faster than the etching rate in the longitudinal direction of the etching stop layer 42, so the etched portion of the preliminary hole 47 is transversely expanded. At this time, the first pattern 44a of the second insulating layer 44 is etched at a high etching selectivity with respect to the etching stop layer 42 (i.e., the first pattern 44a of the second insulating layer 47 is etched at a higher etching rate than the etching stop layer 42). Preferably, the etching selectivity is at a ratio of about 10–40 to 1. The isotropic etching can be carried out by dipping the first pattern 44a of the second insulating layer 44 into an etchant, such as BOE (buffered oxide etchant), which selectively etches the first pattern 44a of the second insulating layer 44.

Figure 2D:
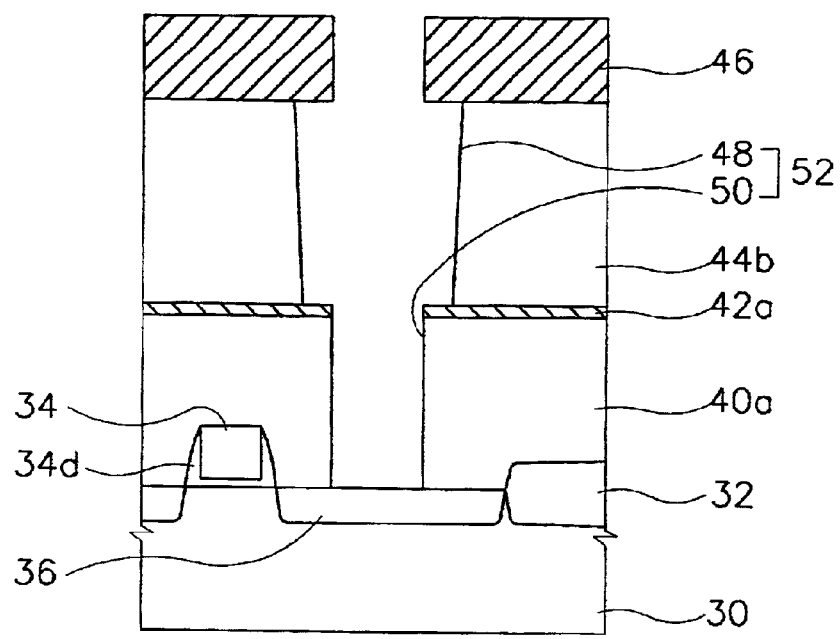

Referring to FIG. 2D, the semiconductor substrate 30 is exposed by etching a predetermined portion of a bottom surface of the first hole 48, so that a second hole 50 having an etching area narrower than the etching area of the first hole 49 is formed. In detail, the etching stop layer 42 and the first insulating layer 40 are anisotropically etched by using the photoresist pattern 46 as an etching mask without removing the photoresist pattern 46 formed on the first hole 48, thereby forming an etching stop layer pattern 42a and a first insulating layer pattern 40a. Since the photoresist pattern 46 is formed by exposing an upper portion of the source region 36, if the photoresist pattern 46 is used as the etching mask, a lower portion of the second hole 50 makes contact with a center portion of the source region 36. That is, the second hole 50 continuously extends from the lower portion of the first hole 48 and has a width smaller than a width of the first hole 48. The anisotropic etching process is carried out by supplying a mixed gas of $C_5F_8$, $O_2$, $CH_2F_2$, Ar, and Co, at an appropriate combination of the gas components.

Accordingly, by performing the manufacturing steps described in FIG. 2B to FIG. 2D, a hole 52 is formed. The hole 52 has a narrow area for making contact with the semiconductor substrate 30, and an upper portion thereof is enlarged.

As described above, the photoresist pattern 46 formed in the step illustrated in FIG. 2B is used as the etching mask when the isotropic etching or the anisotropic etching process is carried out with respect to the second insulating layer 44 or the first insulating layer 40. Therefore, the photoresist pattern 46 has to be precisely patterned in such a manner that an hole in the photo-resist pattern 46 on a portion of the second insulating layer is formed in an area that corresponds to an upper center portion of the source (electrode) region 36 of the semiconductor substrate 30. In addition, the photoresist pattern 46 is required to maintain its shape without being etched during the etching processes that are being carried out several times with respect to the first and second insulating layers 40 and 44. Accordingly, the first and second insulating layers 40 and 44 are etched with an etching selectivity at an etching ratio of 5–25 to 1 with respect to the photoresist pattern 46, thereby preventing the photoresist pattern 46 from deforming after a plurality of etching processes have been completed.

Figure 2E:
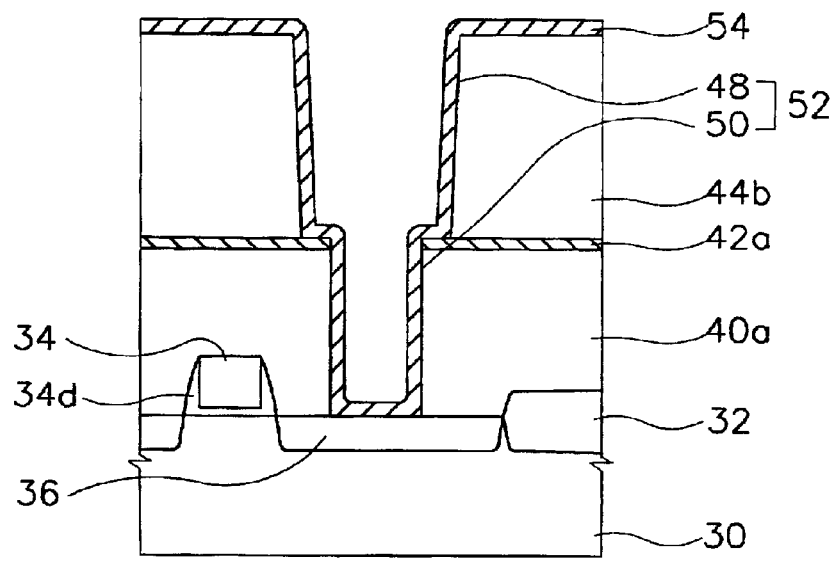

Referring to FIG. 2E, a first conductive layer 54 is formed by uniformly depositing a conductive material above the second insulating layer 44b, along the sidewalls of the first and second holes 48 and 50 and the bottom surface of the second hole 50, after removing the photoresist pattern 46. The first conductive layer 54 is used for forming a storage electrode of the capacitor.

The conductive material includes poly-silicon doped with impurities, and the thickness of the first conductive layer 54 is in the range of about 20 to 100 nm. The poly-silicon layer has a small thickness with a superior deposition characteristic, so that the poly-silicon layer is deposited on the sidewalls and the bottom surface of the hole 52 without filling the hole 52. A contact plug is formed by filling the second hole 50 with the conductive material using conventional techniques. However, the storage electrode of the present invention is formed by depositing the first conductive layer 54 making contact with the source region 36 of the semiconductor substrate 30. Accordingly, the surface area of the storage electrode is enlarged so that the storage capacitance of the storage electrode is increased.

Figure 2F:
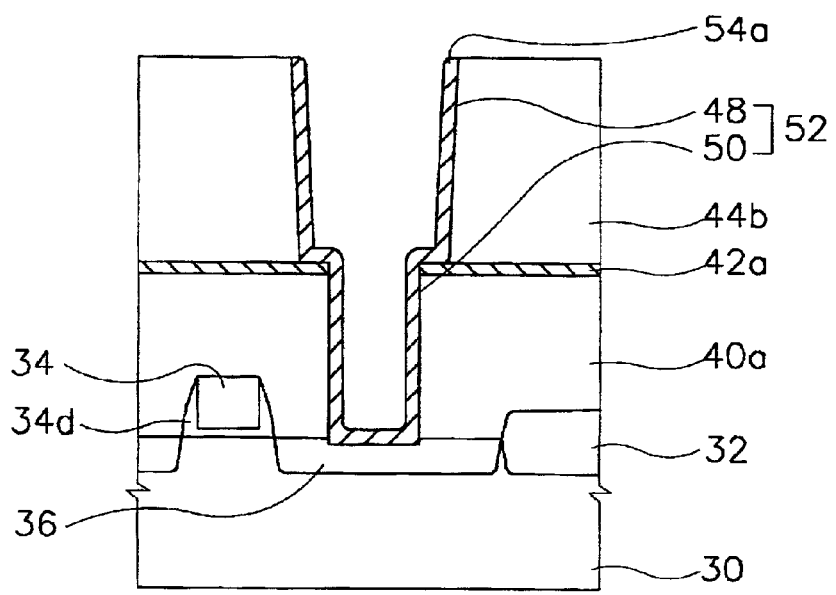

Referring to FIG. 2F, the first conductive layer 54 deposited on the second insulating layer 44b, and on the sidewalls and the bottom surface of the hole 52 is subjected to an etch back process in such a manner that the second insulating layer 44b adjacent the opening of the hole 52 is exposed, thereby forming a first conductive layer pattern 54a.

The etch-back process is carried out so as to separate nodes of storage electrodes between adjacent capacitors when the capacitors are repetitively formed on the semiconductor substrate 30. The etch-back process may be performed by a chemical mechanical polishing (CMP) process or a dry etching process.

Figure 2G:
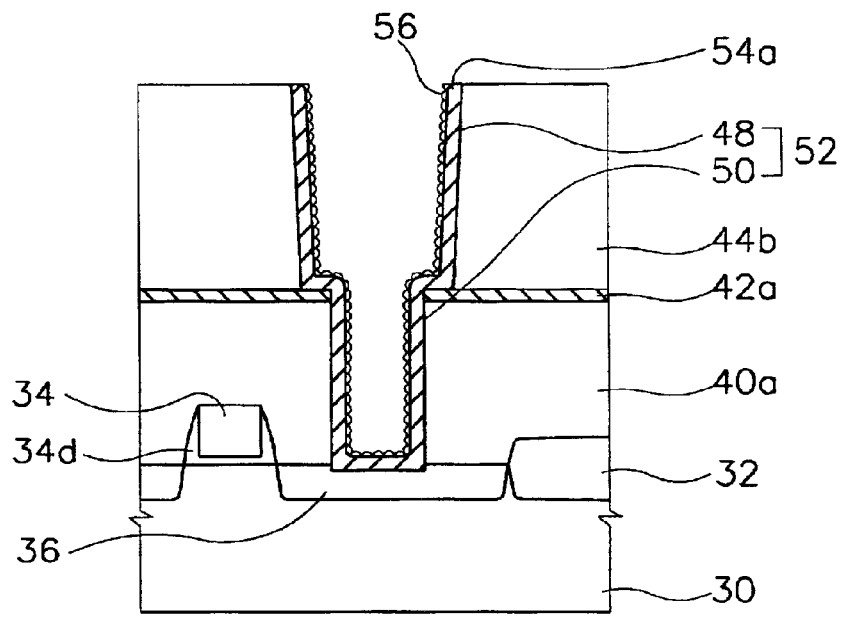

Referring to FIG. 2G, a hemispherical silicon grain (HSG) 56 is formed on the exposed surface of the first conductive layer pattern 54a, which is separate in each of the nodes. That is, the HSG 56 is grown on the surface of the first conductive layer pattern 54a which is deposited on the sidewalls and the bottom surface of the hole 52. Therefore, the surface area of the first conductive layer pattern 54a is further increased, so that the storage capacitance of the capacitor is further increased.

Figure 2H:
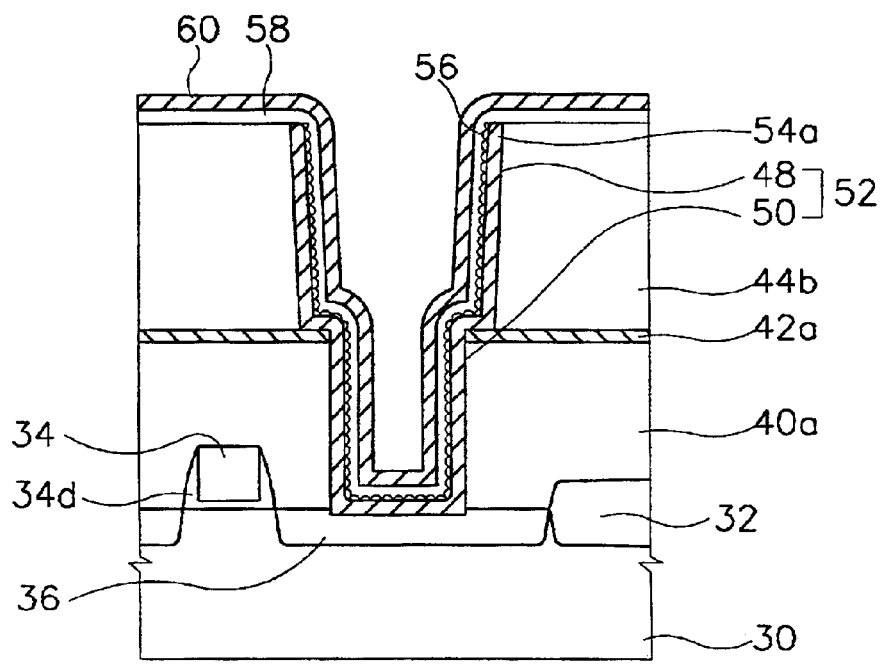

Referring to FIG. 2H, a dielectric layer 58 and a second conductive layer 60 are sequentially formed on the first conductive layer pattern 54a, coated with the HSG 56, to form the capacitor. The second conductive layer 60 acts as a plate electrode of the capacitor.

Accordingly, it is possible to form the hole 52 having a narrow area at the bottom, which makes contact with the semiconductor substrate, and an upwardly enlarged area, which is formed by isotropic etching, at an upper portion of the hole 52. Since the storage electrode is formed at the sidewall and the bottom surface of the hole 52, the storage capacitance of the capacitor can be increased. In addition, the hole 52 is formed by carrying out the photolithography process for forming the photo-resist pattern only once, so the process is simplified.

Second Embodiment

As shown in FIG. 2G, in the first embodiment of the present invention, the HSG 56 is formed on the inner surface of the first conductive layer pattern 54a which is deposited on the sidewalls and bottom of the hole 52. According to a feature of a second embodiment of the present invention, however, the HSG 56 is formed not only on the inner surface of the first conductive layer pattern 54a, but also on an outer surface of the first conductive layer pattern 54a, thereby further increasing the storage capacitance of the capacitor. The second embodiment of the present invention is substantially identical to the first embodiment of the present invention, except for the above features. In the description of the second embodiment, the reference numerals identical to the reference numerals of the first embodiment represent the same elements.

FIGS. 3A to 3D are cross-sectional views of a semiconductor device illustrating a method for manufacturing a capacitor of a semiconductor device according to a second embodiment of the present invention.

Figure 3A:
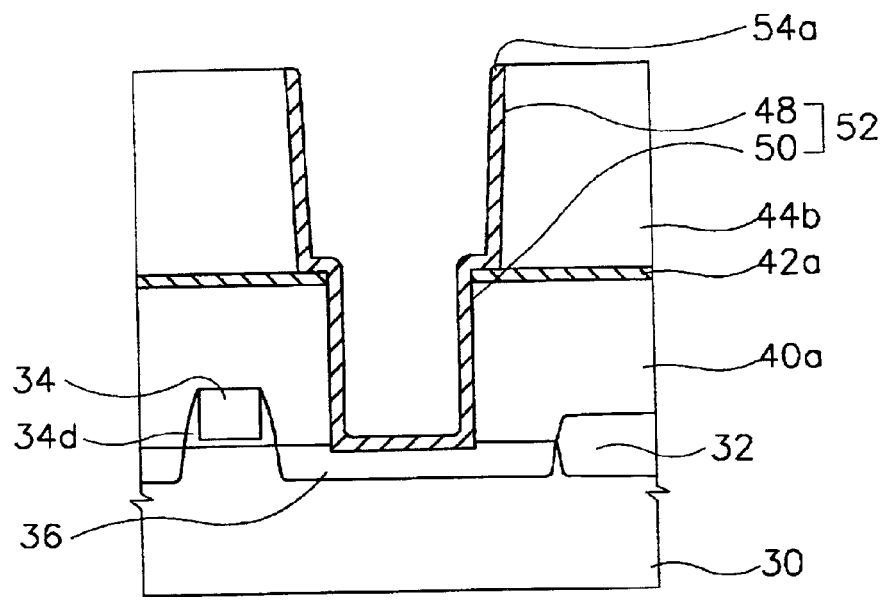
FIGS. 3A to 3D are cross-sectional views of a semiconductor device illustrating a method of manufacturing a capacitor of a semiconductor device according to a second embodiment of the present invention.

Referring to FIG. 3A, a hole 52 is formed by carrying out the processes described with respect to FIGS. 2A to 2F of the first embodiment. The hole 52 has a narrow area at the bottom, which makes contact with the semiconductor substrate 30, and an upwardly enlarged area, which is formed by an isotropic etching, at an upper portion of the hole 52. A first conductive layer 54 is deposited over the second pattern 44b of the second insulating layer 44 and in the hole 52, and an etch-back process is carried out with respect to the first conductive layer 54, whereby conductive layer pattern 54a is formed.

Figure 3B:
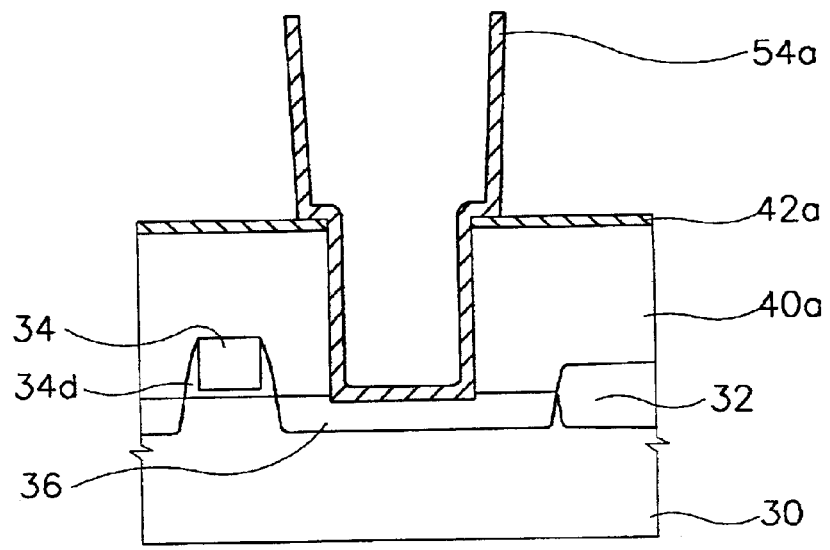

Referring to FIG. 3B, the second pattern 44b of the second insulating layer 44 is etched until the etching stop layer pattern 42a is exposed, so that the second pattern 44b of the second insulating layer 44 is completely removed.

At this stage, only the etching stop layer pattern 42a and the first conductive layer pattern 54a remain on the upper portion of the first insulating layer pattern 40a, as shown in FIG. 3B. The second pattern 44b of the second insulating layer 44 is removed by performing a wet etching process using an etchant capable of selectively etching the insulating layer.

Figure 3C:
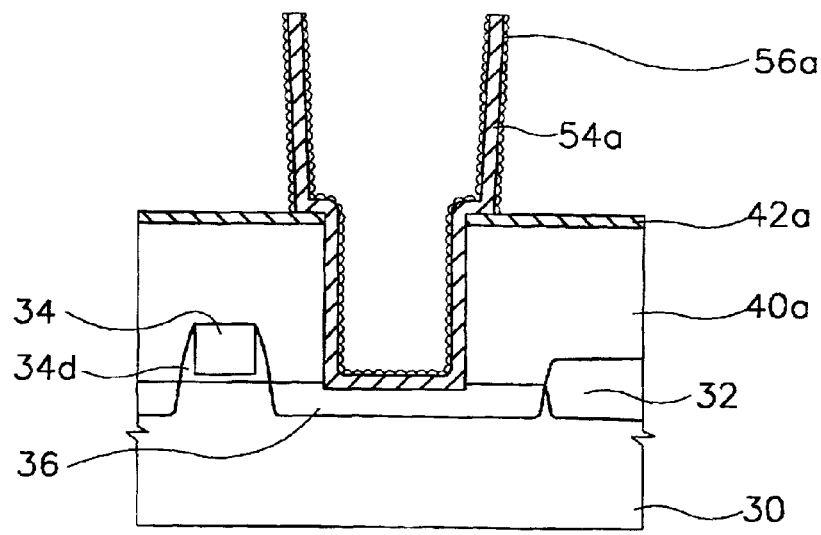

As illustrated in FIG. 3C, a storage electrode is formed by growing HSG 56a on the surface of the first conductive layer pattern 54a. At this time, the inner and outer surfaces of the first conductive layer pattern 54a placed on the first insulating layer pattern 40a are exposed to the exterior, so the HSG 56a can be formed on the inner and outer surfaces of the first conductive layer pattern 54a.

Accordingly, the amount of the deposited HSG 56a is increased as compared with the amount of the HSG deposited in the first embodiment, and as a result, the surface area of the storage electrode of the second embodiment is enlarged, thereby increasing the storage capacitance of the capacitor.

Figure 3D:
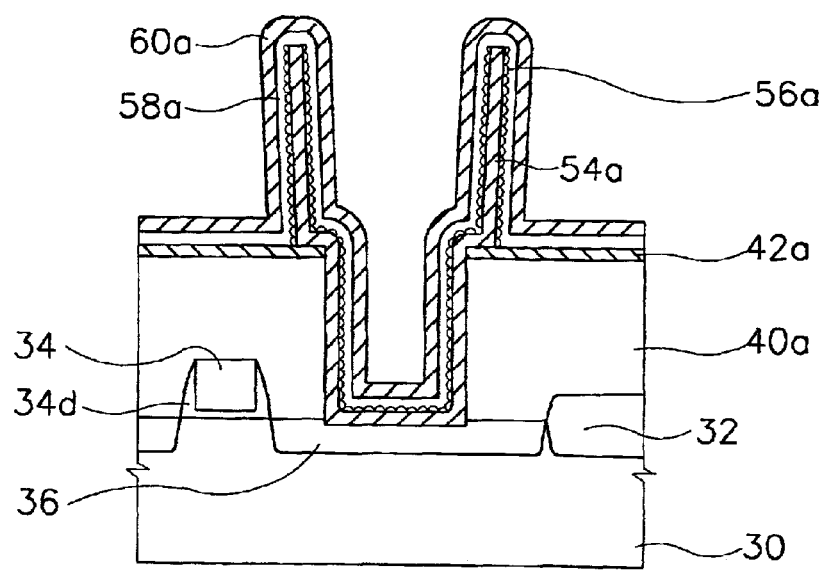

Referring to FIG. 3D, a dielectric layer 58a and a second conductive layer 60a are sequentially deposited on the first conductive layer pattern 54a coated with the HSG 56a so as to form a capacitor. The second conductive layer 60a acts as a plate electrode of the capacitor.

According to the second embodiment of the present invention, the surface area of the storage electrode is larger than the surface area of the storage electrode according to the first embodiment of the present invention, and the storage capacitance of the capacitor is further increased.

As described above, a capacitor can be formed by performing the photo-lithography process only once for the entire etch-back process. Therefore, the potential for failure of the semiconductor device due to multiple photolithography and etch-back processes may be reduced or prevented, with the result that the yield of the semiconductor device can be improved. In addition, the present invention provides a storage electrode by shallowly depositing conductive material, as opposed to forming a contact plug on an electrode area of the semiconductor substrate. Accordingly, the surface area of the storage electrode is enlarged, with the result that the storage capacitance of the capacitor is increased.

Preferred embodiments of the present invention have been disclosed herein, and although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of manufacturing a capacitor of a semiconductor device, the method comprising the steps of:
   i) sequentially depositing a first insulating layer, an etching stop layer, and a second insulating layer on a semiconductor substrate;
   ii) etching a predetermined portion of the second insulating layer to form a preliminary hole for exposing the etching stop layer;
   iii) forming a first hole by transversely expanding the preliminary hole in the second insulating layer;
   iv) forming a second hole by etching a predetermined portion of the etching stop layer and the first insulating layer at a bottom surface of the first hole, the second hole making contact with an electrode area of the semiconductor substrate and having an area narrower than the first hole;
   v) forming a first conductive layer pattern uniformly on sidewalls of the first and second holes and on a bottom surface of the second hole; and
   vi) sequentially depositing a dielectric layer and a second conductive layer pattern on the first conductive layer pattern.

2. The method as claimed in claim 1, wherein the etching stop layer is formed by depositing a silicon nitride or a silicon oxy-nitride material.

3. The method as claimed in claim 1, wherein the etching stop layer has a thickness in a range between about 5 and about 200 nm.

4. The method as claimed in claim 1, wherein the first and second insulating layers are formed to a thickness in a range between about 100 and about 1500 nm using materials having insulating and reflowing characteristics.

5. The method as claimed in claim 4, wherein the materials used for forming the first and second insulating layers are boro-phospho-silicate-glass (BPSG) or undoped silicate-glass (USG).

6. The method as claimed in claim 1, wherein after forming the first conductive layer pattern, the second insulating layer is removed by a selective etching process to expose both sides of the first conductive layer pattern above the etching stop layer before depositing the dielectric layer and the second conductive layer pattern.

7. The method as claimed in claim 6, comprising the step of forming a hemispherical silicon grain (HSG) layer on an entire surface of the first conductive layer pattern.

8. The method as claimed in claim 6, wherein the selective etching process is a wet etching process.

9. The method as claimed in claim 1, wherein the step of forming the first conductive layer pattern comprises the substeps of:
   a) depositing a first conductive layer on the sidewalls of the first and second holes, on the bottom surface of the second hole, and on the second insulating layer; and
   b) etching back the first conductive layer until the second insulating layer outside the first and second hole is exposed.

10. The method as claimed in claim 9, wherein the first conductive layer has a thickness in a range between about 20 to about 200 nm.

11. The method as claimed in claim 9, wherein the etch-back step is carried out by a dry etching process or a chemical mechanical polishing process.

12. The method as claimed in claim 9, further comprising the step of depositing a hemispherical silicon grain (HSG) layer on the first conductive layer pattern which is deposited on the sidewalls of the first and second holes and on the bottom surface of the second hole.

13. The method as claimed in claim 9, wherein the first conductive layer material is doped poly-silicon.

14. The method as claimed in claim 9, wherein the etch-back process is performed by a chemical mechanical polishing (CMP) process or a dry etching process.

15. The method as claimed in claim 1, wherein the steps of forming the first and the second holes comprise the substeps of:
   a) providing a photoresist pattern for forming the preliminary hole on the second insulating layer;
   b) anisotropically etching the second insulating layer using the photoresist pattern as an etching mask to form the preliminary hole and exposing the etching stop layer;
   c) isotropically etching a sidewall of the preliminary hole in the second insulating layer to transversely expand the preliminary hold to form the first hole; and
   d) anisotropically etching a predetermined portion of the exposed etching stop layer and the first insulating layer at the bottom surface of the first hole using the photoresist pattern as the mask to form the second hole and expose the semiconductor substrate.

16. The method as claimed in claim 15, wherein a hole in the photo-resist pattern is formed on a portion of the second insulating layer in an area that corresponds to an upper center portion of the electrode area of the semiconductor substrate.

17. The method as claimed in claim 15, wherein the first and second insulating layers are etched at an etching selectivity ratio of 5–25 to 1 with respect to the photoresist pattern.

18. The method as claimed in claim 15, wherein the anisotropic etching with respect to the first and second insulating layers is carried out by a dry etching process by supplying a mixed gas including at least one of $C_5F_8$, $O_2$, $CH_2F_2$, Ar, and CO.

19. The method as claimed in claim 15, wherein the isotropic etching with respect to the sidewall of the preliminary hole is carried out such that the second insulating layer has an etching selectivity ratio of about 10–40 to 1 with respect to the etching stop layer.

20. The method as claimed in claim 15, wherein the isotropic etching with respect to the sidewall of the preliminary hole in the second insulating layer is carried out by a wet etching process.

21. The method as claimed in claim 20, wherein the wet etchant is a buffered oxide etchant (BOE).

* * * * *